United States Patent [19]

Vavreck et al.

[11] Patent Number: 5,402,453
[45] Date of Patent: Mar. 28, 1995

[54] APPARATUS AND METHOD FOR RELIABLY CLOCKING A SIGNAL WITH ARBITRARY PHASE

[75] Inventors: Kenneth E. Vavreck, Maple Shade; Lee R. Dischert, Medford, both of N.J.

[73] Assignee: Panasonic Technologies, Inc., Secaucus, N.J.

[21] Appl. No.: 184,652

[22] Filed: Jan. 21, 1994

[51] Int. Cl.⁶ ............... H03D 1/00; H04B 7/10; H04L 7/00
[52] U.S. Cl. ................ 375/118; 375/373; 375/342; 375/347; 375/354
[58] Field of Search ............ 375/118, 119, 100, 106, 375/95, 111

[56] References Cited

U.S. PATENT DOCUMENTS

| | | | |
|---|---|---|---|
| 4,206,479 | 6/1980 | Hayward | 358/160 |
| 5,099,477 | 3/1992 | Taniguchi | 375/118 |
| 5,128,970 | 7/1992 | Murphy . | |
| 5,146,477 | 9/1992 | Cantoni | 375/112 |
| 5,157,696 | 10/1992 | Hara | 375/100 |
| 5,274,676 | 12/1993 | Gosi | 375/100 |
| 5,297,173 | 3/1994 | Hikmet | 375/118 |

OTHER PUBLICATIONS

Manual for RCA TBC-8000 Digital Time Base Corrector, pp. 22-23, (May 1981).

Primary Examiner—Edward L. Coles, Sr.
Assistant Examiner—John Ning
Attorney, Agent, or Firm—Ratner & Prestia

[57] ABSTRACT

A clocking circuit and method for phasing a signal with an unknown phase to a clock signal includes a time requirement duration (TRD) signal which has two states and the duration of one of the states is indicative of a combined setup and hold time requirement for the storage device intended to capture the unknown phase signal. The TRD signal is then clocked as a function of the unknown phase signal and called a toggle clock phase (TCP) signal. The TCP signal is then used to modify the phase of a clock enable for the storage device signal to ensure adequate setup and hold time for the clocking of the unknown phase signal.

7 Claims, 4 Drawing Sheets

APPARATUS AND METHOD FOR RELIABLY CLOCKING A SIGNAL WITH ARBITRARY PHASE

FIELD OF THE INVENTION

The present invention relates generally to signal clocking and, more particularly, it relates to clock and signal phasing circuitry designed to obviate setup and hold time violations.

BACKGROUND OF THE INVENTION

In digital circuits many times it is necessary to have all signals synchronized with a common clock signal (i.e., the system clock signal). A problem arises when a signal needs to be phased to the system clock signal but the signal phase with respect to the system clock is arbitrary. If the signal phase is arbitrary, a possible setup or hold violation exists. That is to say, a transition of an information signal may occur relative to a transition of the system clock signal such that the information signal does not satisfy the time requirements of a storage circuit (e.g., flip-flop). These time requirements require the signal to be stable for a predicted interval immediately prior to (setup) and immediately subsequent to (hold) the active clock edge to ensure that the data is stored in the flip-flop. Violating these time requirements, which effectively means the data input signal and the clocking signal transition within close proximity of one another, can lead to the flip-flop entering an uncertain and unstable state known as metastability. This, in conjunction with the fact that there is almost always some jitter in the signal to be clocked, can cause the signal to be clocked on two possible clock edges. This may cause the digital system to react in an undesired manner.

In at least one attempt to address this problem, an analog phase comparator has been used to measure the phase difference between the signal and clock. This analog measurement is used to determine how to synchronize the reference signal to the clock signal.

SUMMARY OF THE INVENTION

The present invention involves a clocking circuit and method for clocking a signal with an unknown phase. The circuit and method include receiving a primary clock signal and a clock phase (CP) signal and producing a clock enable (CE) signal and a time requirement duration (TRD) signal, wherein the duration of one of the states of the TRD signal is indicative of a time requirement for a storage device intended to capture the unknown phase signal. Then, clocking the TRD signal as a function of the unknown phase signal, clocking the unknown phase signal as a function of the CE signal, and modifying the CP signal as a function of the clocked TRD signal, simply referred to as the toggle clock phase (TCP) signal, such that the CP signal, if a time requirement violation is detected, causes a modification of the phase of the CE signal to ensure adequate setup and hold time for the clocking of the unknown phase signal.

BRIEF DESCRIPTION OF THE DRAWINGS

The invention is best understood from the following detailed description when read in connection with the accompanying drawing, in which.

DETAILED DESCRIPTION OF THE INVENTION

Figure 1:
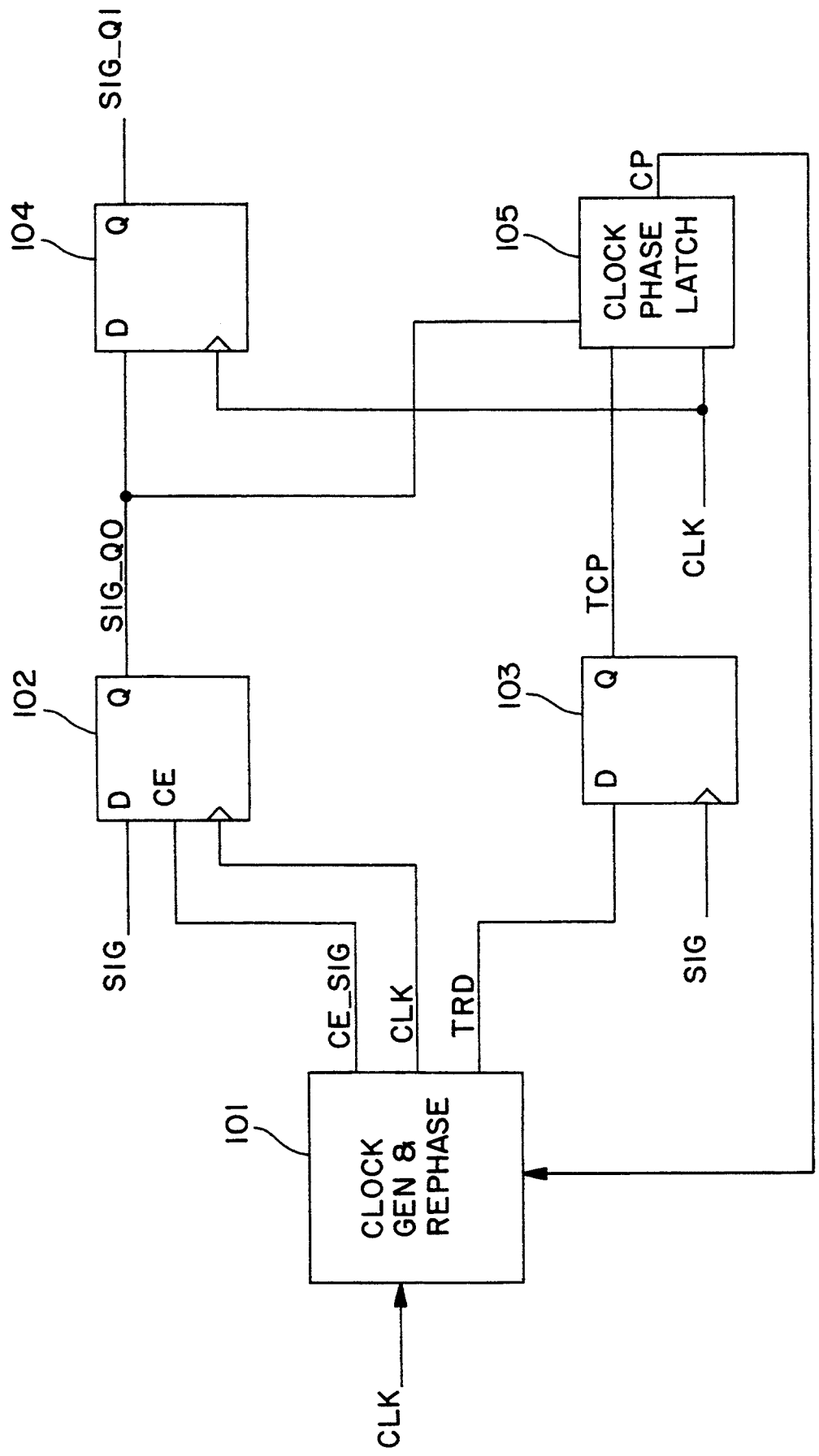
FIG. 1 is a logic schematic diagram of an exemplary embodiment of a clocking circuit for clocking a signal with unknown phase.

FIG. 1 is a schematic diagram of an exemplary circuit for synchronizing an information signal with arbitrary phase (SIG) to a clock signal. It should be noted that the SIG signal transition from low to high desirably has a consistent phase with respect to the main (or primary) clock signal (CLK).

The clock signal generation and rephase circuit 101 receives the CLK signal at an input terminal and produces a clock enable signal (CE_SIG) and a time requirement duration (TRD) signal as the output signal.

A D-type flip-flop 102 receives the information signal SIG at its D input terminal, the CE_SIG signal at its clock enable terminal and the CLK signal at its clock input terminal. Flip-flop 103 receives the SIG signal at its clock input terminal and the TRD signal at the D input terminal and produces a clocked TRD signal (otherwise known as the toggle clock phase TCP signal). Flip-flop 104 receives the SIG_Q0 signal at the D input terminal and the CLK signal at the clock input terminal. Clock phase latch 105 receives the TCP signal at its data input terminal, the SIG_Q0 signal at its clock enable input terminal and the CLK signal at its clock input terminal.

The TRD signal is formed in circuit 101 such that, when the TRD signal is clocked by the SIG signal in flip-flop 103, its state (logic-high or logic-low) indicates whether a possible setup or hold time violation has occurred for flip-flop 102. In other words, the duration of TRD signal, for example, covers the setup and hold time requirements for flip-flop 102. It should be noted that the term "clocked" indicates that the state of an input signal to a storage device (e.g., flip-flop) has been captured on the active edge (i.e., rising edge) of a clock signal.

The TCP signal is logic-high when a possible setup violation exists. If there is a possible setup violation, the logic-high TCP signal is used by clock phase latch 105 to invert the polarity of a clock phase (CP) signal which is fed back to the clock generation and rephase block 101 in order to change the phase of the CE_SIG signal. In the exemplary embodiment of the present invention, the phase of the CE_SIG signal is shifted by 180° (in other words, CE_SIG is inverted).

It should be noted that the changing of the phase of the CE_SIG signal is done after the negative-going transition of the SIG_Q0 signal so that the input signals CLK and CE_SIG of flip-flop 102 are not changed for the current transition of the signal SIG. That is why the signal SIG_Q0 is applied as the clock enable input signal of latch 105.

The CP signal, because it controls the phase of the CE_SIG signal, determines which one of two clocking scenarios are used, these scenarios are described below in detail with reference to FIG. 3. Briefly, it is desirable that the two clocking scenarios overlap. That is, for example, if one clocking scenario has marginal setup time during a particular interval, then the other scenario has more than adequate setup time during that interval.

A useful application of the circuit shown in FIG. 1 is for clocking an NTSC video sync signal with a clock signal which is 8 times the frequency of the color subcarrier signal.

In a standard NTSC video signal, the horizontal line scanning frequency and the color subcarrier frequency are in a predetermined phase relationship. The color subcarrier, Fsc, frequency is 455 times one-half the line scanning frequency. A measure of the relative phase between the color subcarrier and horizontal sync edge is referred to as subcarrier-to-horizontal (scH) phase. Ideally, the scH phase is zero but, due to various factors (e.g., analog equipment, mismatched group delay, temperature variations) the scH may not be zero.

Figure 2:
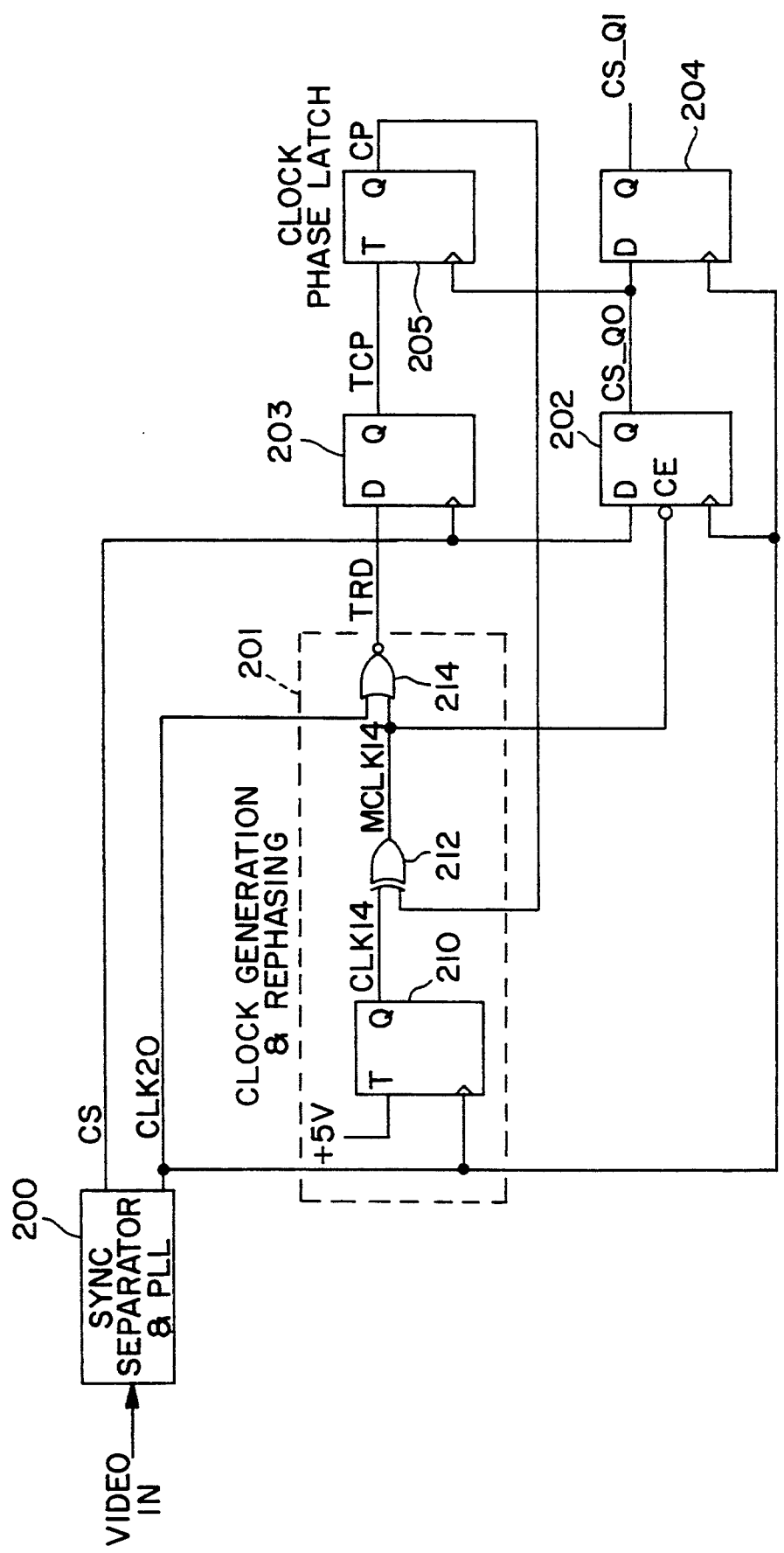
FIG. 2 is a logic schematic diagram of the clocking circuit of FIG. 1 employed in an exemplary application.
Figure 3A:
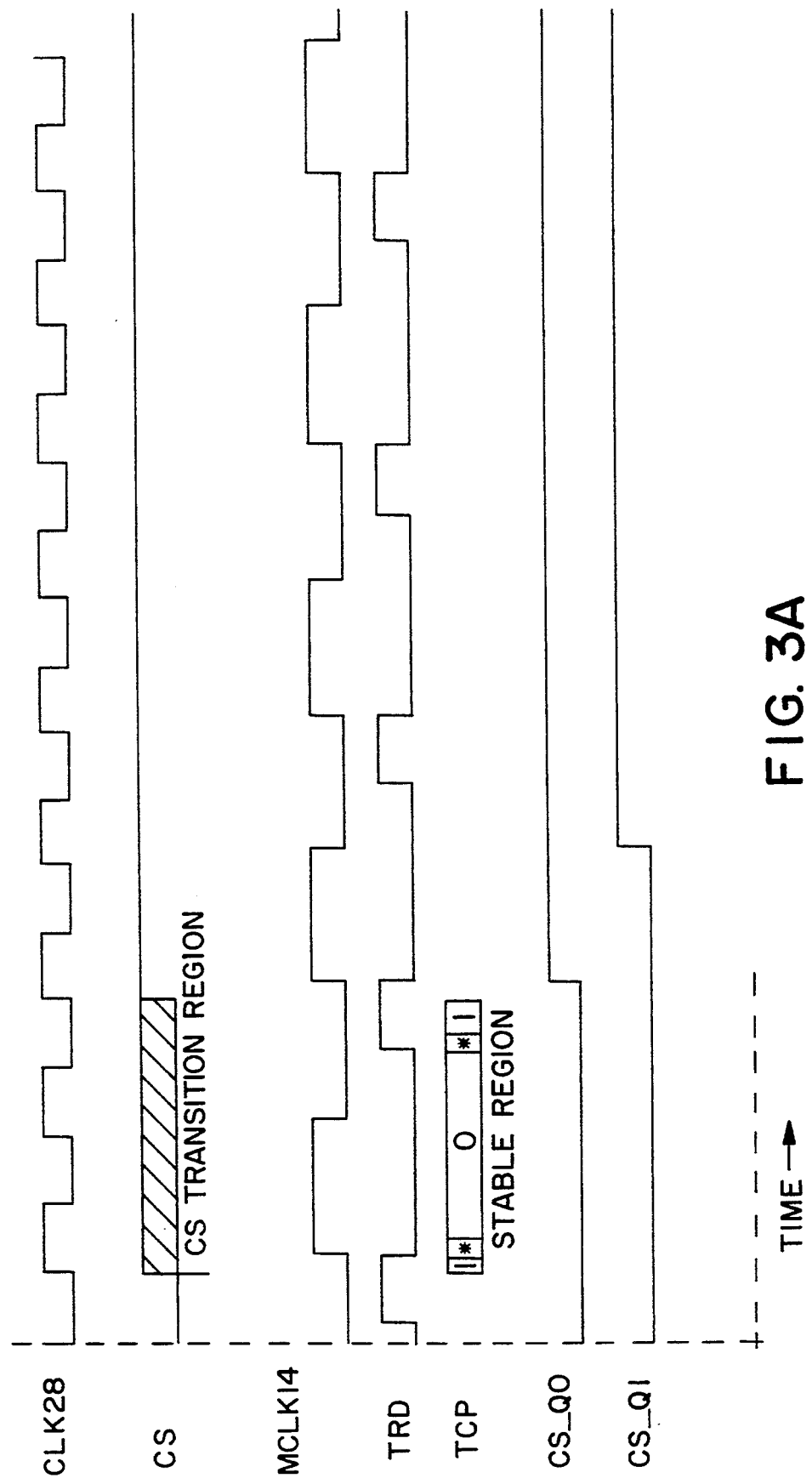
FIGS. 3A and 3B are timing diagrams which illustrate the timing and interrelationships of the signals generated in the schematic of FIG. 2 in two separate scenarios, respectively.
Figure 3B:
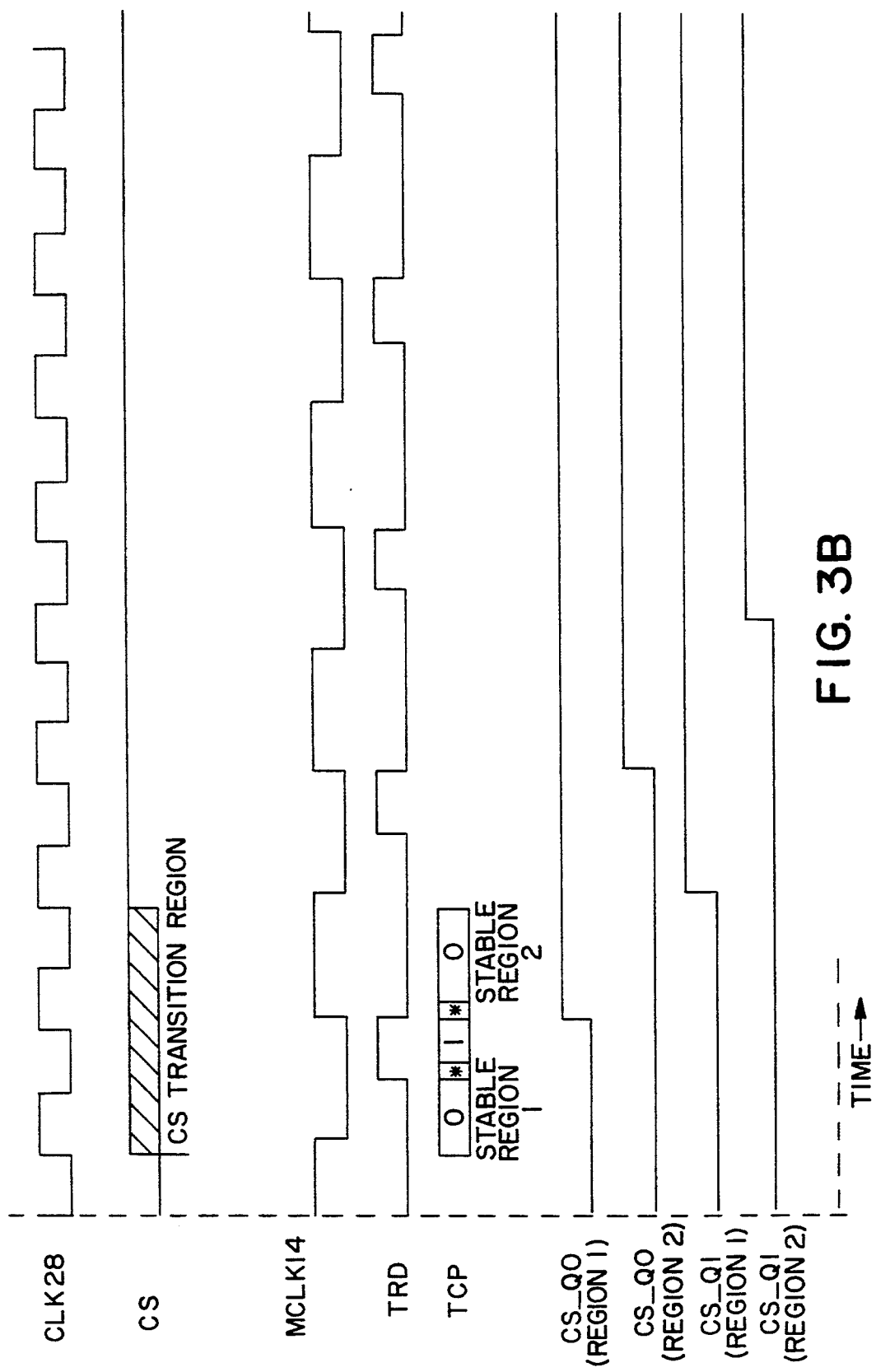

FIG. 2 shows an exemplary system which generates a composite sync signal that is synchronized to a clock signal CLK28, having a frequency of 8 times the color subcarrier frequency (i.e., 28.6 MHz). FIGS. 3A and 3B illustrate an exemplary timing diagrams for the various intermediate signals shown in FIG. 2.

In FIG. 2, a video reference signal is applied to the input terminal of a sync separator and phase lock loop (PLL) circuit 200. This circuit generates the clock signal CLK28 which is locked to the color reference burst composite of the video input signal. In addition, the circuit 200 generates a composite sync (CS) signal. A person having ordinary skill in the art of video signal processing can produce the circuitry necessary to implement block 200.

The remainder of the circuit shown in FIG. 2 is an exemplary embodiment for this application of the clocking circuit shown in FIG. 1. In this embodiment, the composite sync signals (CS) 0 the clock signals CLK28 and MCLK14 (modified clock) correspond to the respective signals SIG, CLK and CE_SIG of FIG. 1. It should be noted that the CS signal has a consistent yet unknown phase relationship to the MCLK14 signal (which, in this example, is 14.3MHz).

As shown in FIG. 2 an exemplary clock toggle generation and rephase circuit includes a toggle-type flip-flop 210, an exclusive OR gate 212 and a NOR gate 214. In this circuit, the MCLK14 signal is logically NORed with the CLK28 signal to produce the TRD signal. Furthermore, it is noted that clock phase latch 205 (which, in the exemplary embodiment, is a toggle-type flip-flop) is clocked with the CS_Q0 signal rather than being clocked with the CLK signal and enabled by the signal the CS_Q0 signal as shown in FIG. 1. Functionally, as can be appreciated by those skilled in the art, these clocking schemes are substantially same.

If a transition of the CS signal occurs when the TRD signal is logic-low (this is the stable region), then the CS signal transition has satisfied the setup/hold time requirements. Obviously, in the exemplary embodiment of the present invention, the clocking of the CS signal will only occur when flip-flop 202 is enabled (i.e., MCLK14 is low).

If, however, the TRD signal is logic-high (this being the unstable region), then the CS signal transition may not have been stable long enough to satisfy the setup/hold time requirements of flip-flop 202. In this case, the phase of the MCLK14 signal is changed. In the exemplary embodiment, because the phase change is 180°, effectively the polarity of MCLK14 is changed. This change is effected by changing the polarity of the CP signal (clock phase signal). Once the polarity of MCLK14 is changed, the TRD signal becomes low during the period in which a setup or hold violation may have existed, thus, eliminating the possibility of a setup or hold time violation on the next transition.

FIGS. 3A and 3B show timing diagrams illustrating the two clocking scenarios and there respective stable regions. In FIGS. 3A and 3B, the timing diagrams for the CLK28 and CS signals are the same for both clocking scenarios. FIG. 3A illustrates the first scenario when CP=0 and FIG. 3B illustrates the second scenario when CP=1.

In FIG. 3A, illustrating the first scenario, the MCLK14 and TRD signals are aligned such that if a transition of the CS signal occurs when TRD=0, the clocking of the CS signal is stable. However, if the clocking of the CS signal occurs when TRD=1 or when TRD is in transition (TRD=*) as indicated by the timing diagram associated with the TCP signal, then a potential setup or hold violation exits which would be indicated by a logic high value being clocked into flip-flop 203 of FIG. 2.

If a logic high signal is clocked into flip-flop 203, then, as described above, TCP is clocked into flip-flop 205 on the next falling edge of the CS signal which, in turn, changes the phase of the MCLK14 signal and produces the second clocking scenario.

As shown in FIG. 3B, in the second clocking scenario, the stable regions are at the beginning and end of the period rather than in the middle as in the first scenario. That is to say, the change in phase of the MCLK14 signal ensures that a CS signal transition which, in the first scenario occurred during an unstable region (a 1 or * state), now occurs during a stable region (0 state). Moreover, the converse is also true. If the setup or hold time violation occurred during the second scenario, then TCP and CP signals would cause a phase change of the MCLK14 signal such that the first scenario is implemented.

Although the present invention has been described with respect to details of contained embodiments thereof, it is not intended that such details be limiting upon the scope of the invention.

What is claimed:

1. A clocking circuit for clocking a signal with an unknown phase comprising:
   clock generation and rephase means for receiving a primary clock (CLK) signal and for producing a clock enable (CE) signal and a time requirement duration (TRD) signal, the TRD signal may be in first and second states;
   means for clocking the unknown phase signal as a function of the CS signal and the CLK signal to produce a clocked unknown phase signal, wherein a duration of the first state of the TRD signal is indicative of a time requirement for the means for clocking the unknown phase signal;
   means for clocking the TRD signal as a function of the unknown phase signal to produce a toggle clock phase (TCP) signal;
   means for modifying the phase of the CS signal as a function of the state of the TCP signal to ensure adequate time for clocking of the unknown phase signal in the means for clocking the unknown phase signal.

2. The clocking circuit as claimed in claim 1, wherein the time requirement is a setup requirement.

3. The clocking circuit as claimed in claim 1, wherein the time requirement is a combination of setup and hold requirements.

4. The clocking circuit as claimed in claim 1, wherein the means for modifying is a toggle-type flip-flop having the TCP signal at its input terminal and producing a clock phase (CP) signal at its output terminal which is fed back to the clock generation and rephase means.

5. The clocking circuit as claimed in claim 4, wherein the toggle-type flip-flop is clocked by a delayed version of the unknown phase signal.

6. The clocking circuit as claimed in claim 1, wherein the clock generation and rephase means includes a toggle-type flip-flip which is clocked by the CLK signal and produces a secondary clock signal, an exclusive OR gate for exclusive ORing the secondary clock signal and a clock phase (CP) signal to produce the CE signal, and a NOR gate for NORing the CE signal and the CLK signal to produce the TRD signal.

7. A method for clocking a signal with an unknown phase comprising the steps of:
   processing a primary clock (CLK) signal and a clock phase (CP) signal to produce a clock enable (CE) signal and time requirement duration (TRD) signal therefrom, wherein the TED signal has a first and second state, a duration of the first state of the TRD signal is indicative of a time requirement for clocking of the unknown phase signal;
   clocking the unknown phase signal as a function of the CE signal and the CLK signal to produce a clocked unknown phase signal; and
   clocking the TRD signal as a function of the unknown phase signal to produce a toggle clock phase (TCP) signal;
   modifying the phase of the CE signal as a function of the state of the TCP signal to ensure adequate time for the clocking of the unknown phase signal.

* * * * *